United States Patent [19]

Laughton

[11] Patent Number: 4,591,734

[45] Date of Patent: May 27, 1986

[54] INTEGRATABLE CIRCUIT FOR CONTROLLING TURN-OFF VOLTAGE RATE-OF-CHANGE OF NON-REGENERATIVE VOLTAGE-CONTROLLED SWITCHING SEMICONDUCTOR DEVICES

[75] Inventor: William J. Laughton, Schenectady, N.Y.

[73] Assignee: General Electric Company, Schenectady, N.Y.

[21] Appl. No.: 604,359

[22] Filed: Apr. 27, 1984

[51] Int. Cl.[4] .................. H03K 4/94; H03K 3/353; H03K 17/284
[52] U.S. Cl. ........................... 307/248; 307/571; 307/246; 307/263; 307/268; 307/270
[58] Field of Search .............. 307/248, 571, 270, 268, 307/253, 263, 246

[56] References Cited

U.S. PATENT DOCUMENTS

| 4,256,979 | 3/1981 | Hendrickson et al. | 307/571 |
| 4,445,055 | 4/1984 | Bete | 307/571 |
| 4,477,742 | 10/1984 | Janutka | 307/571 |

*Primary Examiner*—John S. Heyman
*Attorney, Agent, or Firm*—Geoffrey H. Krauss; James C. Davis, Jr.; Marvin Snyder

[57] ABSTRACT

An integratable circuit for controlling the turn-off time-rate-of-voltage-change of a non-regenerative power switching device (such as a field-effect transistor, an insulated gate transistor and the like) uses a single capacitive element, in conjunction with a first current source, to provide a ramp voltage generator which is operative only if a ramp generator terminal is disconnected from a circuit common potential. The circuit uses a second current source and a controlled-conduction device to provide a control electrode drive signal to the at least one power switching device, controlling the flow of current through a load from a unipolarity or bipolarity source. The voltage across the controlled-conduction circuit of the power switching device then active is applied in attenuated form to another input of the ramp voltage generator to control the load voltage time-rate-of-change during load current turn-off.

20 Claims, 8 Drawing Figures

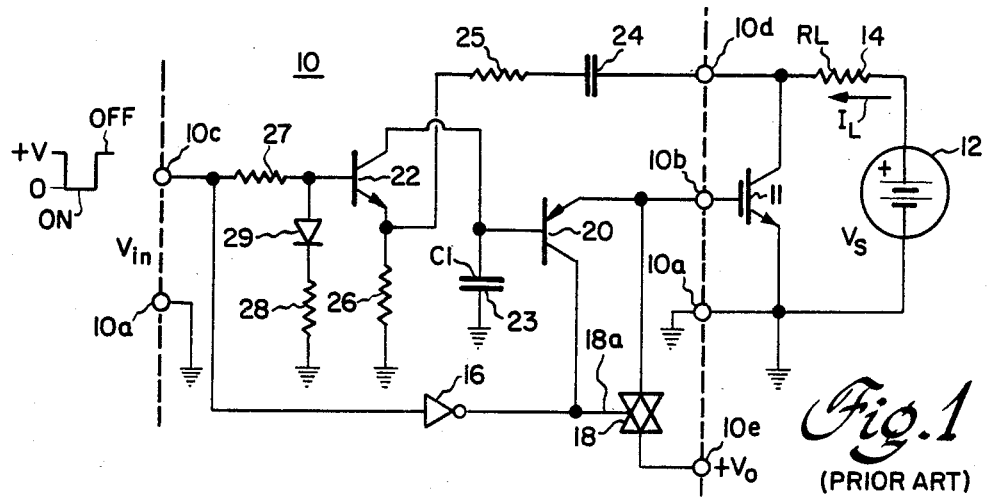
*Fig.1* (PRIOR ART)
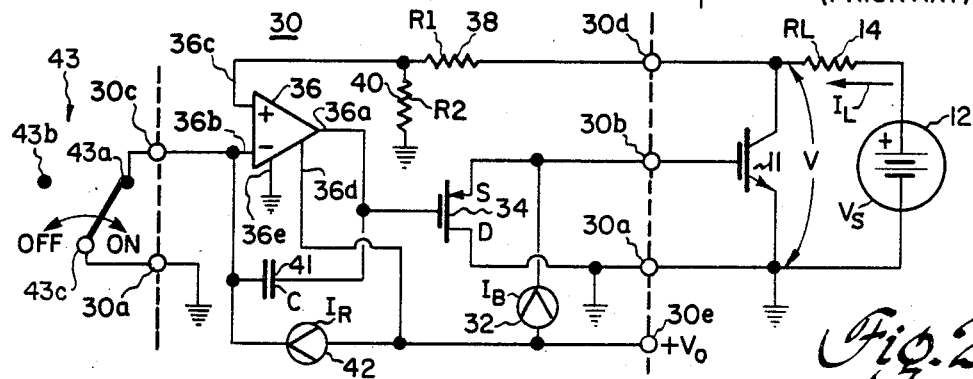
*Fig.2*
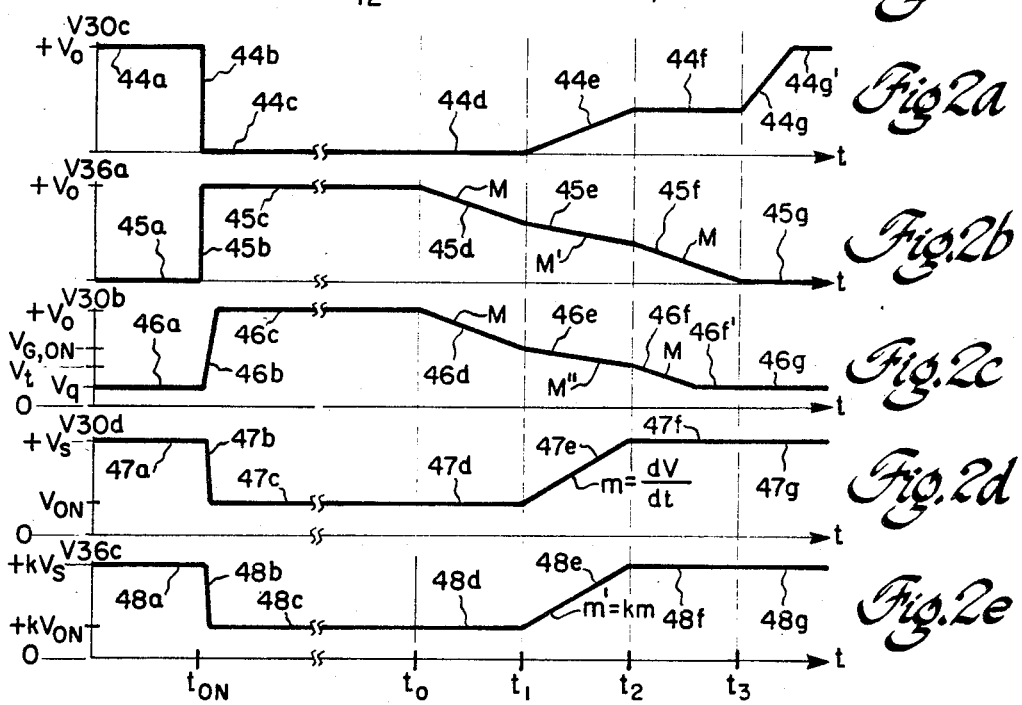
*Fig.2a*
*Fig.2b*
*Fig.2c*
*Fig.2d*
*Fig.2e*

4,591,734

INTEGRATABLE CIRCUIT FOR CONTROLLING TURN-OFF VOLTAGE RATE-OF-CHANGE OF NON-REGENERATIVE VOLTAGE-CONTROLLED SWITCHING SEMICONDUCTOR DEVICES

BACKGROUND OF THE INVENTION

The present application relates to power-switching semiconductors and, more particularly, to a novel integratable circuit for the controlled turn-off switching of non-regenerative voltage-controlled power semiconductor devices, such as field-effect transistors, insulated-gate transistors and the like.

It is well known to minimize the time that a non-regenerative power-switching semiconductor device spends in an "active region", to prevent excessive power dissipation in that device. When voltage-controlled non-regenerative semiconductors, such as power field-effect transistors (FETs), insulated-gate transistors (IGTs) and the like, are utilized for controlling the current flowing through a load, power dissipation is minimized by switching the device from a fully-on condition to a fully-off condition in as rapid a manner as possible, consistent with the maximum dV/dt device limits.

One particularly useful circuit for rapidly turning-on a voltage-controlled power switching device and turning-off the load current flow through that device in a time-controlled manner, was disclosed and claimed in co-pending application Ser. No. 499,579, by Milton D. Bloomer, filed May 31, 1983, now U.S. Pat. No. 4,540,893, issued Sept. 16, 1985 assigned to the assignee of the present invention and incorporated herein by reference in its entirety. In that application, a fast-turn-on, controlled-turn-off circuit similar to that of FIG. 1 was described and claimed. While reference should be had to the aforementioned application for full details, briefly, the circuit 10 of FIG. 1 has the source/emitter electrode of a power FET/IGT device 11 connected to a circuit common potential, at control circuit terminal 10a. The control electrode of device 11 is connected to control circuit terminal 10b, and receives a turn-on or turn-off signal dependent upon that one of the two possible conditions of an input voltage $V_{in}$ at an input terminal 10c, with respect to circuit common terminal 10a. The input signal controls the conduction of a load current $I_L$ from a unipolarity voltage source 12, of magnitude $V_S$, through a load resistance 14, of magnitude $R_L$. An associated switching device collector/anode voltage is provided at a circuit terminal 10d with a magnitude responsive to load current magnitude. Circuit 10 is provided with a source of operating potential, of magnitude $+V_o$, at a fifth terminal 10e. Bloomer's circuit utilizes a logic inverter means 16 having its input connected to control input voltage terminal 10c and its output connected to the control electrode 18a of a bidirectional controlled-conduction means 18. The controlled-conduction circuit of means 18 is connected between terminals 10b and 10e. The emitter electrode of a PNP transistor 20 is connected to terminal 10b, while the collector electrode thereof is connected to the output of inverter 16 and the base electrode is connected both to the collector electrode of an NPN transistor 22 and one terminal of an integrating capacitor 23. The remaining terminal of integrating capacitor 23, of capacitance magnitude C1, is connected to circuit common potential. The emitter electrode of transistor 22 is connected through a series-connected combination of a coupling capacitor 24 and a series resistor 25 to the switching device collector/anode voltage terminal 10d, and also through an emitter resistance 26 to circuit common potential. The circuit input terminal 10c is connected through a serial biasing resistor 27 to the base electrode of transistor 22, which base electrode is coupled, through a series-connected second biasing resistor 28 and temperature-compensating diode 29, to circuit common potential. Bloomer's circuit 10 utilizes transistor 22 as a current source for discharging capacitor 23 to generate a ramp voltage, and utilizes capacitor 24 as a differentiating capacitor. In operation, when the input voltage $V_{in}$ is at a low, substantially zero level, first transistor 22 is cut-off and capacitor 23 is not discharged by transistor 22. The output of inverter 16 is at a high, logic 1 level, turning on means 18 to pull the switching device 11 gate electrode substantially to the high operating potential $+V_o$ magnitude. Simultaneously, both the emitter and collector electrodes of transistor 20 are pulled to a high level, allowing base current to flow from the base electrode of transistor 20 and charge capacitor 23 substantially to the operating voltage $+V_o$ magnitude. Thus, switching device 11 is turned on and load current $I_L$ flows from source 12 through load resistance 14 and device 11. When the input voltage $V_{in}$ at input terminal 10c rises to a high $+V_o$ level, the turn-off cycle is initiated by transistor 22 being biased into conduction to begin to discharge capacitor 23 through resistance 26. At the same time, the output of inverter means 16 falls to a low level, turning off means 18 and simultaneously dropping the voltage at the collector electrode of transistor 20 to a low (substantially zero) voltage level. The switching device control voltage, at terminal 10b, begins to decrease at a first rate, until the switching device saturation threshold $V_{G,ON}$ voltage is reached, at which threshold the magnitude of load current $I_L$ begins to decrease. The decrease in load current provides a proportional change in the voltage at terminal 10d; the time-rate-of-change of the voltage at terminal 10d provides a proportional current flowing through capacitor 24 and resistor 25. This feedback current also flows through emitter resistor 26 and reduces the current flowing through transistor 22, thus any increase in the device voltage/load current rate-of-change slows the discharge rate of capacitor 23 and decreases the rate-of-change of the switching device voltage decrease at terminal 10b, while any decrease in the device voltage/load current rate-of-change speeds up the discharge rate of capacitor 23 and increases the rate-of-change of the switching device voltage decrease at terminal 10b. In this manner, the time-rate-of-change of the device turn-off voltage dV/dt is kept approximately constant during the actual turn-off of the current flowing through the controlled-circuit of the device 11. At some later time, when the conduction threshold $V_t$ voltage of device 11 is reached, load current $I_L$ has fallen to a substantially zero magnitude, and the time-rate-of-change thereof returns the current flowing through capacitor 24 and resistor 25 substantially to zero, increasing the current flowing through transistor 22, with an increase in the rate of discharge of capacitor 23 and the rate of decrease of the voltage at terminal 10b. Thus, after the conduction threshold is reached, the control voltage at terminal 10b decreases at a faster rate until the voltage at 10b is substantially at circuit common potential.

It will be seen that not only the ratio of the value of capacitors 23 and 24 must be held substantially constant, but the absolute capacitive magnitude of each of capacitors 23 and 24 must be held within relatively tight tolerances to achieve a desired dV/dt rate. It will also be seen that capacitor 24 must operate up to the full source voltage $V_S$ value. While circuit 10 can be fabricated in hybrid or partially-integrated form, it is often necessary that high-voltage feedback capacitor 24 be a separate component, having a capacitive value and voltage rating chosen for the particular use. It will also be seen that circuit 10 is not readily implementable in low-cost CMOS integrated circuit technology and cannot have the entire circuit (with the exception of the non-regenerative power switching device 11, source 12 and load 14) contained in a single integrated component.

It is highly desirable to provide a rapid-turn-on/controlled-turn-off circuit for controlling a non-regenerative power switching device, or devices, which can utilize low-cost CMOS integrated circuit technology and which will be devoid of non-integratable control circuit components.

BRIEF SUMMARY OF THE INVENTION

In accordance with the invention, an integratable circuit for controlling the turn-off time-rate-of-voltage-change (dV/dt) of a non-regenerative power switching device, such as an FET, an IGT and the like, utilizes a single capacitive element, along with a first current source, to provide a means for generating a ramp voltage only if a ramp generator terminal is disconnected from a circuit common potential, and utilizes a second current source and a controlled-conduction device to provide a control electrode drive signal to the power switching device. The collector/anode-to-source/cathode voltage of each of at least one power switching device is applied in attenuated form to another input of the ramp voltage generator means to control the load voltage time-rate-of-change during load current turn-off.

In presently preferred embodiments, the fully-integratable rapid-turn-on/controlled-turn-off circuit controls at least one voltage-controlled power switching device in either unipolarity (DC) or bipolarity (AC) source/load circuits.

Accordingly, it is an object of the present invention to provide a novel integratable circuit for controlling the turn-off time-rate-of-change dV/dt of the voltage across a non-regenerative power switching device controlling the flow of current through a load from an associated source.

This and other objects of the present invention will become apparent upon reading of the following detailed description, when considered in conjunction with the drawings.

BRIEF DESCRIPTION OF THE DRAWINGS

FIG. 1 is a schematic diagram of a rapid-turn-on/controlled-turn-off prior art circuit;

FIG. 2 is a schematic diagram of my novel fully-integratable circuit for controlling turn-off of a non-regenerative power switching device;

FIGS. 2a–2e are a set of time-related graphs illustrating the signal waveforms at various points in the circuit of FIG. 2.

DETAILED DESCRIPTION OF THE INVENTION

Figure 3:
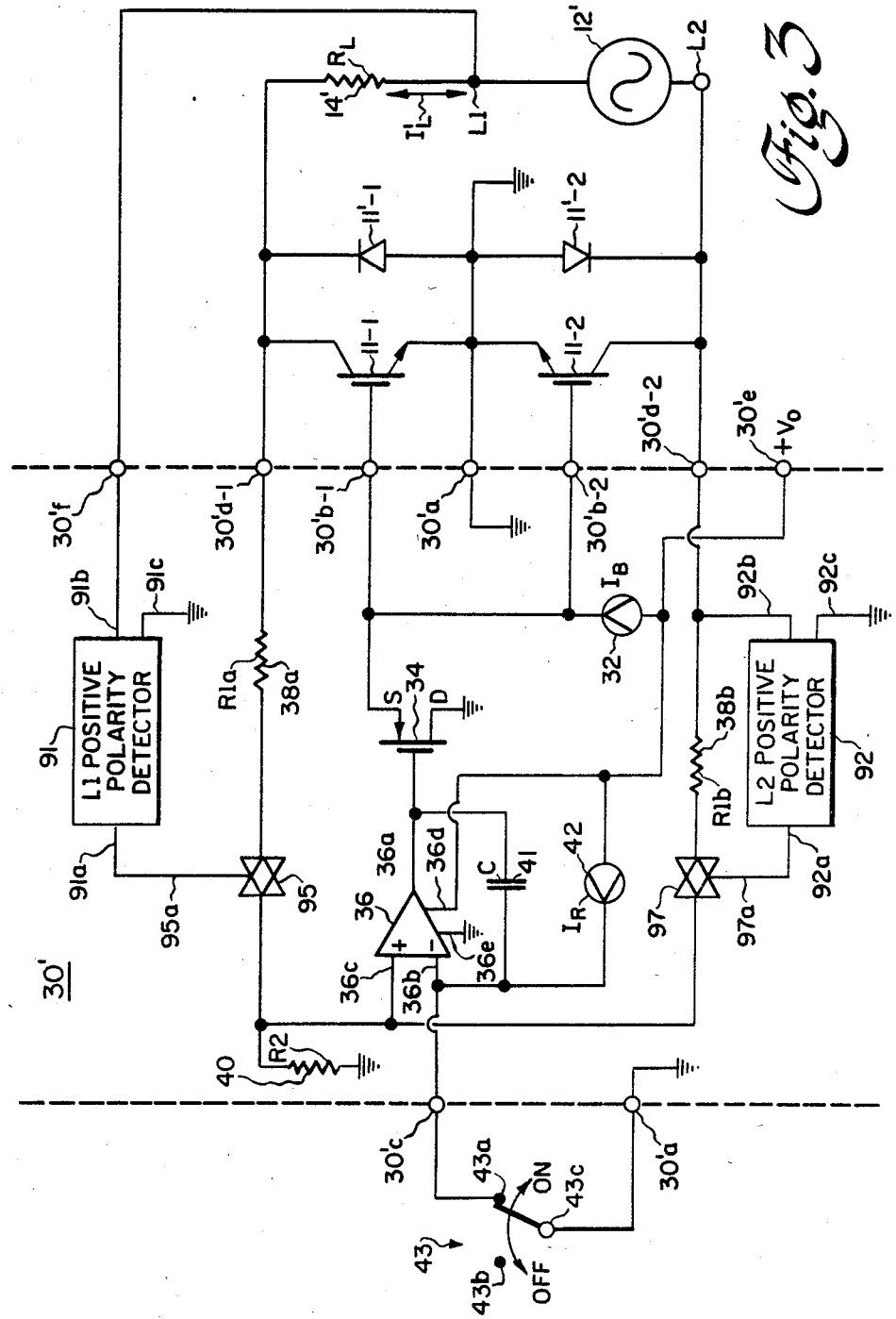
FIG. 3 is a schematic diagram of a fully-integratable circuit for controlling the rapid-turn-on/controlled-turn-off of a plurality of non-regenerative power switching devices for controlling the flow of AC current through a load.

Referring now to FIG. 2, a first presently preferred embodiment of my novel integratable controlled-turn-off circuit 30 is illustrated for controlling the time-rate-of-change of the collector/anode-to-source/cathode voltage of a non-regenerative power switching device 11 in a circuit in which a load 14 is connected in series with a unipolarity voltage source 12. Circuit 30 utilizes a first substantially-constant current generator 32 for generating a bias current $I_B$ into the source electrode of a p-type field-effect transistor (FET) 34. The source electrode of FET 34 is also connected to circuit gate drive output terminal 30b, while the drain electrode of FET 34 is connected to circuit common potential at circuit terminal 30a. The gate electrode of FET 34 is connected to the output 36a of an operational amplifier. A first, inverting-input 36b of the operational amplifier is connected to circuit control input 30c. Another, non-inverting +input 36c of the operational amplifier is connected via a first resistance 38, of resistance magnitude R1, to the switching device collector/anode voltage input terminal 30d. Input 36c is connected through a second resistance 40, of resistance magnitude R2, to circuit common potential. An integration capacitor 41, of capacitance magnitude C, is connected between operational amplifier output 36a and input 36b. A second current source 42, for generating a substantially-constant ramp current $I_R$, is connected to input 30c. Both current sources 32 and 42 are connected to respective circuit terminals 30b and 30c from the circuit operating potential terminal 30e, and may utilize zero-biased FETs and other substantially-constant-magnitude current source means known to the integrated circuit arts. The circuit operating potential $+V_o$ at input terminal 30e is also connected to the operating potential input 36d of operational amplifier 36, which has a common potential terminal 36e connected to circuit common potential.

In operation, my novel integratable rapid-turn-on/controlled-turn-off circuit 30 is controlled by a switching means 43 which completes the connection between input terminal 30c and common terminal 30a to control device 11 to the "on", or current-conductive, condition, and disconnects control input terminal 30c from common circuit terminal 30a to switch device 11 to the "off", or non-conductive, condition. While switching means 43 is shown as a single-pole, double-throw mechanical switch, having a first "on" selectable terminal 43a, a second "off" selectable terminal 43b, and a common terminal 43c, it should be understood that any switching means capable of being controlled to provide respective relatively low and relatively high impedance conditions between terminals 30a and 30c for the respective "on" and "off" conditions will be seen to be utilizable.

Assuming that switching means 43 has been in the open condition for some time, e.g. analogous to common switch terminal 43c being connected to "off" selectable terminal 43b, a high-impedance, "open" condition exists at input terminal 30c. Current source 42 has charged capacitance 41 to the $+V_o$ operating potential at terminal 30c, as shown by portion 44a of FIG. 2a. The voltage V36a at the operational amplifier output 36a is, accordingly, at a substantially zero voltage level, as shown in portion 45a of FIG. 2b. This voltage drives FET 34 and causes the voltage at switching device control electrode terminal 30b to be at a magnitude $V_q$ equal to the source-drain voltage drop across the controlled-conduction channel of FET 34, as shown in portion 46a of FIG. 2c. Since voltage $V_q$ has been selected to be less than the conduction threshold voltage $V_t$ at which switching device 11 begins to conduct current, switching device 11 is in the turned-off condition. Accordingly, the switching device collector/anode voltage, at terminal 30d is, as shown in portion 47a of FIG. 2d, at the source voltage $V_s$ magnitude, and the divided voltage V36c, at operational amplifier non-inverting input 36c, is, as shown in portion 48a of FIG. 2e, equal to the source voltage $V_s$ times the attenuation factor k, where $k=R2/(R1+R2)$.

At time $t_{on}$, switching means 43 is closed to connect control input terminal 30c to circuit common terminal 30a. The control input terminal voltage V30c accordingly falls to a substantially zero magnitude, as shown in portion 44c, following falling edge 44b, in FIG. 2a; all of source 42 current $I_R$ is shunted to circuit common potential through switching means 43 and no current flows through capacitor 41. The operational amplifier output voltage V36a rises, with rising edge 45b, to substantially the circuit operating potential $+V_o$ level, as shown in portion 45c of FIG. 2b. The voltage at switching device control electrode terminal 30b rises, in portion 46b, as the switching device input capacitance is charged, and shortly after time $t_{on}$ reaches substantially the circuit operating potential $+V_o$ magnitude, as shown in portion 46c of FIG. 2c; as the voltage level of portion 46c is greater than both the conduction threshold voltage $V_t$ level and the saturation threshold $V_{G,ON}$ voltage level of the switching device, device 11 is rapidly turned-on to the full-conduction condition, i.e. is rapidly saturated. Accordingly, the load current $I_L$ begins to increase when voltage V30b becomes greater than the conduction threshold $V_t$ magnitude and reaches the full load current magnitude (set by the source voltage $V_s$ and the load resistance $R_L$) when voltage V30b reaches the saturation threshold voltage $V_{G,ON}$. The switching device collector/anode voltage V30b thus falls during portion 47b from the source voltage $+V_S$ magnitude to the device "on" voltage $V_{ON}$, e.g. to a saturation voltage V of about 2-4 volts, and remains at the $V_{ON}$ level, as in portion 47c of FIG. 2d, while switching means 42 is closed. Responsive thereto, the divider output voltage V36c falls at portion 48b and remains at low level 48c (FIG. 2e) as long as device 11 remains in the turned-on condition. Thus, the rapid-turn-on operation of circuit 30 is achieved.

The controlled turn-off action of circuit 30 commences with the opening of switching means 41, to provide a high-impedance condition between circuit input common terminal 30a and control input terminal 30c. The current source 42 ramp current $I_R$ now commences to flow through capacitor 41. As the switching device 11 was saturated, the non-inverting input voltage V36c remains at its low level, of magnitude $kV_{ON}$, in portion 48d, forcing the voltage at inverting input 36b, and therefore the input terminal voltage V30c, to remain substantially at zero volts, as in portion 44d. The flow of current through capacitor 41 must therefore result in a decreasing voltage, shown in portion 45d, of the operational amplifier output voltage V36a. This results in a decreasing-magnitude portion 46d for the control electrode terminal voltage V30b, as the voltage across the source-drain conduction-channel of FET 34 is reduced. The voltage-rate-of-change M in the operational amplifier output voltage V36a, at the FET 34 gate electrode, is substantially the same as the rate-of-change M in the switching device control electrode voltage at terminal 30b, and is established by the ratio of the ramp current source 42 ramp current $I_R$ and the capacitor 41 capacitance, i.e. $dV36a/dt=I_R/C$. Voltages V36a and V30b decrease at rate M until the control electrode voltage V30b reaches the saturation threshold voltage $V_{G,ON}$ of switching device 11, at time $t_1$. At this time, switching device 11 comes out of saturation and a decreasing change in the control electrode voltage, at terminal 30b, effects a decreasing change in the switching device controlled current, which is load current $I_L$. Thus, the switching device collector/anode voltage V30d begins to increase, as shown in portion 47e, and the increasing voltage is divided by resistors 38 and 40 and fed back to the operational amplifier non-inverting input 36c. Since the operational amplifier differential input voltage must remain small due to the high operational amplifier gain, the voltage at inverting input 36b, which is the voltage V30c, will track the rising non-inverting input voltage V36c, as the collector/anode voltage V30d rises. Since the operational amplifier output voltage V36a is referenced to the operational amplifier negative input 36b voltage through capacitor 41, as the input voltage V30c rises, in portion 44e, the rate-of-change of voltage V36a must decrease, as shown by new voltage-rate-of-change M' in portion 45e of FIG. 2b. This results in a correspondingly slower rate-of-change M'' in the control electrode voltage V30b, as shown in portion 46e of FIG. 2c, starting at time $t_1$ and continuing until time $t_2$, at which time the conduction threshold $V_t$ is reached and no further change in load current $I_L$ is effected by a decreasing change in the switching device 11 control electrode voltage. The rate-of-change M'' of the voltage at operational amplifier output 36a, between times $t_1$ and $t_2$, is the difference between the initial ramp voltage rate-of-change, i.e. $I_R/C$, and the voltage rate-of-change (dV36c/dt) at the operational amplifier input 36c, which rate-of-change dV36c/dt is equal to slope M' which is equal to km where k is the resistor ratio $R2/(R1+R2)$. Thus, the switching device collector/anode voltage V30d must change from the fully-on voltage $V_{ON}$ to the source voltage $V_S$ between times $t_1$ and $t_2$, providing a substantially-linearly-increasing voltage V30d with a slope $m=dV/dt$, where V is the voltage across the controlled-conduction circuit of switching device 11. The operational amplifier non-inverting input voltage V36c also rises (in portion 48e), with a slope m' which is essentially equal to km, to a maximum voltage of $kV_s$ at time $t_2$.

In this manner, the switching device control electrode voltage is controlled by feedback to the operational amplifier non-inverting input to keep the switching device controlled-circuit voltage rate-of-change dV/dt approximately constant; this slope m is established by the equation:

$$m=dV/dt=(I_R/C)((R1+R2)/R2).$$

It will thus be seen that the voltage gain (e.g. $g_m R_L$, where $g_m$ is the transconductance) of the switching device and the almost unity gain of FET 34, functioning as a source follower, provide, at most, only second-order effects upon the $m=dV/dt$ rate-of-change of the terminal 30*d* voltage portion 47*e* and corresponding operational amplifier non-inverting input voltage portion 48*e*. Thus, for a desired dV/dt of about 5 volts/microsecond, the fully integratable controlled-turned-off circuit 30 utilizes a ramp current $I_R$ of about 10 microamperes generated by current source 42, an integration capacitor 41 capacitance C value of about 25 picofarads and a resistive voltage divider ratio ($R_1/R_2$) of about 11.5:1. It will be seen that these current-source and capacitive values and resistance ratios are relatively easily realizable in a CMOS integrated circuit, and that CMOS implementations of bias source 32, FET 34 and operational amplifier 36 are equally as realizable, resulting in a relatively low-cost integrated circuit which requires no external components to set a desired controlled-turn-off dV/dt value for an associated control switching device 11.

At time $t_2$, the switching device control electrode voltage V30*b* reaches the conduction voltage $V_t$ threshold, and no further decrease in load current $I_L$ occurs for a decreasing control electrode voltage V30*b*. As the switching device controlled-conduction circuit voltage V has reached the source voltage $V_s$ magnitude, the voltage V30*d* remains at the source voltage magnitude in subsequent portions 47*f*, between time $t_2$ and time $t_3$, and portion 47*g*, after time $t_3$. Therefore, the voltage at operational amplifier non-inverting input 36*c*, is the voltage of portions 48*f* and 48*g* and is at a magnitude of $kV_s$. This causes the operational amplifier inverting input voltage V30*c* to remain substantially constant during portion 44*f*, between time $t_2$ and $t_3$, as the operational amplifier output voltage V36*a* continues to decrease, in portion 45*f*, at the former, greater rate-of-change M, until a substantially zero operational amplifier output voltage level is reached at time $t_3$. Thereafter, the operational amplifier output remains at the substantially zero level 45*g* until switching means 43 is again closed to command a switching device 11 turn-on condition. In the interval between time $t_2$ and $t_3$, as the FET 34 gate voltage falls along portion 45*f*, due to the decrease in operational amplifier output voltage, the voltage across the controlled-conduction channel of FET 34 continues to decrease, decreasing the switching device control electrode terminal 30*b* voltage V30*b*, in portion 44, until the FET voltage $V_q$ is reached, whereafter the voltage $v_q$ appears between terminals 30*b* and 30*a*, in portion 46*f'*. At time $t_3$, the operational amplifier output voltage V36*a* finally reaches the substantially zero magnitude and continues thereafter at this magnitude in portion 45*g*, while the operational amplifier inverting input voltage increases, in portion 44*g*, until substantially equal to the operating voltage $V_0$ level at the portion 44*g'*, reestablishing the fully-turned-off initial conditions.

Thus, it will be seen that circuit 30 provides for the rapid turn-on and controlled turn-off of a voltage-controlled power switching device 11 operating to switch load current $I_L$ through a load 14 connected to a unipolarity source 12.

Referring now to FIG. 3, the integratable rapid-turn-on/controlled-turn-off circuit 30' can be utilized with a plurality of voltage-controlled non-regenerative switching devices, e.g. the pair of IGT switching devices 11-1 and 11-2, to control the turning-on and turning-off of a bidirectional load current $I_L'$ through a load 14' connected to a bipolarity (AC) source 12'. The source is provided with first and second line terminals L1 and L2. Line terminal L1 is connected to one terminal of load 14', having its other terminal connected to the collector/anode of the first voltage-controlled switching device 11-1, to the cathode of a reverse-conduction diode 11'-1 connected in parallel with the controlled-conduction circuit of device 11-1, and to a first collector/anode voltage terminal 30'*d*-1 of integratable circuit 30'. Line terminal L1 is also connected to a first auxiliary terminal 30'*f* of intergratable circuit 30'. The second line terminal L2 is connected to the collector/anode of the second voltage-controlled switching device 11-2, to the cathode of another reverse-conduction diode 11'-2 in parallel with the controlled-conduction circuit of switching device 11-2, and to a second switching device controlled-circuit voltage terminal 30'*d*-2 of integratable circuit 30'. The control electrode of each of switching devices 11-1 and 11-2 is respectively connected to the associated one of control electrode terminals 30'*b*-1 and 30'*b*-2, which are, as illustrated, internally connected together within integratable circuit 30'. The circuit common potential at circuit terminal 30'*a* is connected to the source/emitter electrodes of both switching devices 11-1 and 11-2, and to the anode terminals of both reverse-conduction diodes 11'-1 and 11'-2. Operating potential $+V_o$ is provided at circuit terminal 30'*e*. Switching means 43 again appears between circuit input control terminal 30'*c* and circuit common potential terminal 30'*a*. As in the single switching device controlling circuit 30 of FIG. 2, a bias current source 32 is connected between the operating potential terminal 30'*e* and the switching device control electrode terminals 30'*b*-1 and 30'*b*-2. The controlled-conduction source-drain circuit of an FET device 34 is connected from the junction of current source 32 and control electrode terminals 30'*b*-1 and 30'*b*-2, to circuit common potential. The gate electrode of FET 34 is connected to the output 36*a* of the operational amplifier 36, and to one terminal of integration capacitor 41. The operational amplifier inverting input 36*b* is connected to the other terminal of integration capacitor 41, to the control input terminal 30'*c* and to the substantially-constant current output of second current source 42, from which ramp current $I_R$ is supplied from operating potential terminal 30'*e*.

In accordance with another aspect of the present invention, for use with a bipolarity (AC) source 12', the non-inverting operational amplifier input 36*c* is connected, in addition to the connection through resistance R2 of resistor 40 to common potential, through a pair of controlled switching means 95 and 97, to one or the other of first voltage divider resistors 38*a* or 38*b*, each having a substantially similar resistance value R1a or R1b. Each of resistors 38*a* or 38*b* respectively has the remaining terminal thereof connected to one of switching device controlled-circuit input terminals 30'*d*-1 and 30'*d*-2, respectively. The control inputs 95*a* and 97*a* of the respective controlled-conduction means 95 or 97, are respectively connected to the respective outputs 91*a* and 92*a* of respective line 1 and line 2 positive polarity detector means 91 and 92. Each positive polarity detector means 91 and 92 has an input 91*b* or 92*b* connected to the associated one of auxiliary terminal 30'*f* or terminal 30'*d*-2, for receiving, with respect to ground potential provided at inputs 91*c* and 92*c*, the voltage at respective line terminal L1 or L2. The output 91*a* of the line 1 positive polarity detector means 91 is active, enabling conduction through associated first switching means 95, whenever the voltage at line terminal L1 is positive with respect to circuit common potential, while the output of line 2 positive polarity detector means 92 is active, enabling conduction through associate second switching means 97, whenever the voltage at line terminal L2 is positive with respect to circuit common terminal 30'a. It will be seen that when line terminals L1 and L2 alternately reverse polarity, only the switching device 11-1 or 11-2 having a collector/anode coupled to a positive-polarity line terminal is conducting, while the reverse-conduction diode 11-2 or 11-1, in parallel with the switching device then receiving a negative-polarity line voltage (with respect to circuit common terminal 30'a) is conducting. Therefore, during any particular half-cycle polarity, only the first resistor 38a or 38b associated with an active power switching device 11-1 or 11-2 is connected, through associated switching means 95 or 97, to operational amplifier input 36c. Since the switching device control electrodes are driven in parallel and the conduction devices 95 and 97 are controlled by line polarity, the switching device collector-/anode dV/dt signal is, during controlled-turn-off, fed back to the operational amplifier from only that one of power switching devices 11-1 or 11-2 then in the conducting condition. The actual operation of the circuit and the associated switching devices 11-1 and 11-2 are identical, in all other respects, in this bipolarity source configuration as with the operation described for the unipolarity configuration of FIG. 2.

It will be seen that conduction means 95 and 97 can be controlled bidirectional-conduction gates utilizing CMOS technology, in manner well known to the intergrated circuit arts, as can the positive polarity detector means 91 and 92. Complete integration of integratable circuit 30' is therefore possible in a small integrated circuit package, typically having no more than eight leads. The same integrated control circuit is capable of being utilized for controlling the plurality of external switching devices necessary for controlling bidirectional current flow through a load from a bipolarity source 12', or, if connected as circuit 30 of FIG. 2, to control at least one switching device 11 for controlling the unidirectional load current flow from a unipolar source.

While several preferred embodiments of my novel integratable circuit for controlling turn-off voltage rate-of-change of non-regenerative voltage-controlled switching semiconductors have been explained in detail herein, many modification and variations will now become apparent to those skilled in the art. It is my intent, therefore, to be limited only by the scope of the appending claims, and not by way of the specific details and instrumentalities presented by way of explanation of presently preferred embodiments herein.

What I claim is:

1. An integratable circuit for controlling the switching between a fully-turned-on condition and a fully-turned-off condition of a non-regenerative power semiconductor device having a control electrode and a controlled-conduction circuit through which a current flows responsive to the magnitude of a signal at the control electrode being between a conduction threshold and a saturation threshold, said circuit comprising:
    means for receiving an input signal having first and second characteristics each respectively for directing the switching device to an associated one of said fully-turned-on and fully-turned-off conditions of the current flow therethrough;
    means for providing said control electrode signal at a magnitude sufficient to rapidly fully-turn-on said switching device responsive to said first input signal characteristic and for generating said control electrode signal as a ramp signal having a first time-rate-of-change responsive to said input signal second characteristic; and
    means providing a feedback signal of magnitude responsive to the time-rate-of-change of the voltage across said controlled-conduction circuit, for causing said control-electrode-signal-providing ramp generating means to reduct the time-rate-of-change of the control electrode signal to a second time-rate-of-change, less than the first time-rate-of-change, responsive to the magnitude of the current flow through said device controlled-conduction circuit when between said conduction and saturation thresholds;
    said control-electrode-signal-providing means comprising means responsive to said second input signal characteristic for generating a voltage ramp having a slope controlled by said feedback signals, and comprising: an operational amplifier having a first input receiving said input signal, a second input receiving said feedback signal, and an output coupled to said switching device control electrode; an integrating element coupled between said operational amplifier output and said first input; and means for providing a substantially-constant ramping current to said operational amplifier first input; said control-electrode-signal-providing means also comprising means for buffering said ramp voltage for application to said switching device control electrode.

2. The integratable circuit of claim 1, further comprising: means for receiving a circuit operating potential with respect to said circuit common potential; and means receiving said ramp signal for providing said control electrode signal at substantially said operating potential magnitude in said fully-turned-on condition and for providing said control electrode signal at a potential approaching said circuit common potential in said fully-turned-off condition.

3. The integratable circuit of claim 1, wherein said buffering means comprises: a field-effect transistor having a control electrode receiving said ramp voltage and having a controlled-conduction channel connected between said switching device control electrode and a circuit common potential; and means for providing a current of substantially constant magnitude from said circuit operating potential to the junction between said buffering device controlled-conduction circuit and said switching device control electrode.

4. The integratable circuit of claim 1, wherein said integrating element is a capacitive element coupled between said operational amplifier first input and output.

5. The integratable circuit of claim 4, wherein said feedback signal providing means comprises a voltage attenuator having an input receiving the voltage across the controlled-conduction circuit of said switching device and having an output for providing said feedback signal to said operational amplifier second input.

6. The integratable circuit of claim 5, wherein said voltage attenuator comprises a first resistance, of magnitude R1, having a first terminal receiving said switching device controlled-conduction circuit voltage and a second terminal connected to said operational amplifier second input, and a second resistance element, of magnitude R2, connected between said operational amplifier second input and said circuit common potential.

7. The integratable circuit of claim 6, wherein said integration capacitance has a capacitance magnitude C and said substantially-constant ramp current means provides a current of magnitude $I_R$; the values of said first and second resistance elements, said capacitance element and said ramping current generating means being established to provide a desired time-rate-of-change dV/dt of the voltage V across said switching device controlled-conduction circuit.

8. The integratable circuit of claim 7, wherein the rate-of-change dV/dt is substantially equal to $(I_R/C)(R1+R2)/R2$.

9. The integratable circuit of claim 8, wherein said ramp current $I_R$ is on the order of 10 microamperes.

10. The integratable circuit of claim 8, wherein said capacitance C has a value on the order of 25 picofarads.

11. The integratable circuit of claim 8, wherein said first and second resistance elements have a ratio $R_1/R_2$ on the order of 11.5:1.

12. The integratable circuit of claim 6, wherein said first and second resistance elements have a ratio $R_1/R_2$ on the order of 11.5:1.

13. The integratable circuit of claim 1, wherein said integratable circuit is provided in a single integrated circuit.

14. The integratable circuit of claim 1, further comprising: a plurality of polarity detecting means, each having a separate input and an output, for each providing a separate output signal responsive to a signal then at the associated input having a predetermined polarity with respect to said circuit common potential; means for receiving at least a plurality of feedback signals; and means for selecting that one of said plurality of feedback signals to be connected to said ramp generating means responsive to the presence of an output signal from at least one of said plurality of polarity detecting means.

15. The integratable circuit of claim 14, wherein said plurality of feedback signal receiving means comprises a pair of circuit terminals each provided with a different feedback signal, and said feedback signal providing means comprises: a resistance element having a first terminal at which said feedback signal is provided and a second terminal connected to said circuit common potential; first and second controlled-conduction means, each controlled to a conductive condition by an associated first one of said polarity detecting means at a different time from the time at which the other of said controlled-conduction means is controlled to conduction by an associated second one of said pair of polarity detecting means; and second and third resistance elements each connected in series with an associated one of said controlled-conduction means, between said first resistance element first terminal and that associated one of a said pair of circuit terminals then receiving the predetermined signal polarity.

16. In combination, the integratable circuit of claim 1; at least one power switching device; a source of electrical current; and a load coupled between said at least one switching device and said source and having a current flowing therethrough from said at least one switching device controlled-conduction circuit under control of said control circuit and responsive to said first and second input conditions.

17. The combination of claim 16, wherein said source is a unipolarity source.

18. In combination, the integratable circuit of claim 1; a plurality of power switching devices; a source of bipolarity electrical current; and a load coupled between said plurality of switching devices and said source and having a current flowing therethrough from at least one switching device controlled-conduction circuit under control of said control circuit and responsive to said first and second input conditions.

19. An integratable circuit for controlling the switching between a fully-turned-on condition and a fully-turned-off condition of a non-regenerative power semiconductor device having a control electrode and a controlled-conduction circuit through which a current flows responsive to the magnitude of a signal at the control electrode being between a conduction threshold and a saturation threshold, said circuit comprising:

means for receiving an input signal having first and second characteristics each respectively for directing the switching device to an associated one of said fully-turned-on and fully-turned-off conditions of the current flow therethrough;

means for providing said control electrode signal at a magnitude sufficient to rapidly fully-turn-on said switching device responsive to said first input signal characteristic and for generating said control electrode signal as a ramp signal having a first time-rate-of-change responsive to said input signal second characteristic;

means providing a feedback signal of magnitude responsive to the time-rate-of-change of the voltage across said controlled-conduction circuit, for causing said control-electrode-signal-providing ramp generating means to reduce the time-rate-of-change of the control electrode signal to a second time-rate-of-change, less than the first time-rate-of-change; responsive to the magnitude of the current flow through said device controlled-conduction circuit when between said conduction and saturation thresholds;

a plurality of polarity detecting means, each having a separate output signal responsive to a signal then at the associated input having a predetermined polarity with respect to said circuit common potential;

means for receiving at least a plurality of feedback signals; and means for selecting that one of said plurality of feedback signals to be connected to said ramp generating means responsive to the presence of an output signal from at least one of said plurality of polarity detecting means.

20. The integratable circuit of claim 19, wherein said plurality of feedback signal receiving means comprises a pair of circuit terminals each provided with a different feedback signal, and said feedback signal providing means comprises: a resistance element having a first terminal at which said feedback signal is provided and a second terminal connected to said circuit common potential; first and second controlled-conduction means, each controlled to a conductive condition by an associated first one of said polarity detecting means at a different time from the time at which the other of said controlled-conduction means is controlled to conduction by an associated second one of said pair of polarity detecting means; and second and third resistance elements each connected in series with an associated one of said controlled-conduction means, between said first resistance element first terminal and that associated one of a said pair of circuit terminals then receiving the predetermined signal polarity.

* * * * *